United States Patent [19]
Su et al.

[11] Patent Number: 5,674,354
[45] Date of Patent: Oct. 7, 1997

[54] METHOD FOR ETCHING A CONDUCTING LAYER OF THE STEP-COVERED STRUCTURE FOR SEMICONDUCTOR FABRICATION

[75] Inventors: Anna Su, Hsinchu Hsien; Water Lur, Taipei, both of Taiwan

[73] Assignee: United Microelectronics Corporation, Hsinchu, Taiwan

[21] Appl. No.: 537,322

[22] Filed: Sep. 29, 1995

[51] Int. Cl.$^6$ ............................................. H01L 21/302
[52] U.S. Cl. .................. 156/650.1; 156/643.1; 156/662.1; 156/653.1
[58] Field of Search ............... 156/643.1, 650.1, 156/651.1, 653.1, 662.1

[56] References Cited

U.S. PATENT DOCUMENTS

| | | | |
|---|---|---|---|
| 4,608,118 | 8/1986 | Curtis et al. | 156/643 |
| 4,789,426 | 12/1988 | Pipkin | 156/643 |
| 4,818,334 | 4/1989 | Shwartzman et al. | 156/643 |
| 5,223,083 | 6/1993 | Cathey et al. | 156/643 |
| 5,228,950 | 7/1993 | Webb et al. | 156/643 |
| 5,238,872 | 8/1993 | Thalapaneni | 437/190 |
| 5,336,365 | 8/1994 | Goda et al. | 156/643 |
| 5,449,433 | 9/1995 | Donohue | 156/643.1 |

*Primary Examiner*—R. Bruce Breneman
*Assistant Examiner*—George Goudreau
*Attorney, Agent, or Firm*—Townsend and Townsend and Crew LLP

[57] ABSTRACT

A method for etching a conducting layer in a semiconductor device fabrication procedure is disclosed. The method provides for the formation of the conductor path with defined and precise control over the path width. The fabricated semiconductor device has a step-raised layer-covering structural configuration on a substrate, and the step-raised layer-covering structural configuration forms re-entrances when an insulation layer is formed over the step-raised layer-covering structure and the portion of the substrate surrounding the structure. The method includes forming a conducting layer on the insulation layer and then forming a shielding mask on the conducting layer for defining a conducting path with a predetermined pattern. The method further includes applying an anisotropic etching process for removing portions of the conducting layer not covered by the shielding mask. The method also forms residual stringers of the conducting layer in the re-entrances. The method then applies an anisotropic etching process to form first protecting layers covering the sidewalls of the conducting path, as well as second protecting layers covering the stringers, wherein the first protecting layers are thicker than the second protecting layers. The method finally applies an isotropic etching process to remove the second protecting layers and the stringers covered by the second protecting layers. Since the first protecting layers are thicker, the second protecting layers and their covered stringer can be removed completely before the first protecting layers are totally consumed.

9 Claims, 2 Drawing Sheets

METHOD FOR ETCHING A CONDUCTING LAYER OF THE STEP-COVERED STRUCTURE FOR SEMICONDUCTOR FABRICATION

BACKGROUND OF THE INVENTION

1. Field of the Invention

The present invention relates in general to a method for etching a conducting layer of a step-covered structure produced in a semiconductor fabrication process. In particular, the present invention relates to a method for etching a conducting layer of the step-covered structure during the semiconductor fabrication process to provide good control over critical dimensions in the fabrication of the semiconductor device. More particularly, the present invention relates to a method for etching a conducting layer of the step-covered structure in the semiconductor fabrication process that can be free from strip-shaped stringers formed as a result of anisotropic etching due to the presence of re-entrances.

2. Technical Background

A conventional method of etching a conducting layer of a step-covered structure during semiconductor device fabrication involves procedural steps that comprise control of the device's topographic dimensions or decrease control over the critical dimensions of the device being fabricated. The diminished critical dimensions have become unacceptable for present-day submicron devices.

One problem area is control of "step coverage" in the semiconductor structural configuration involving the step-covered structure of the fabricated device. Step coverage refers to the ratio of the thickness of the covering layer in the area of the step-recessed region on the substrate to the thickness of the covering layer on the step-raised portion of the semiconductor device. A step coverage of 100%, namely, the condition of equal thickness achieved in the raised and recessed areas, is ideal, but rare. Usually the step coverage is less than 100%. In other words, the thickness of the covering layer on top of the step-raised structure is normally greater than that of the step-recessed portion of the semiconductor device.

FIGS. 1a–1c show cross-sections of a portion of a semiconductor device with step-covered structural configuration. The cross-sectional views are selected process stages for etching a conducting layer in accordance with the conventional method.

As can be seen in the drawing, the conventional method of conducting layer etching is basically a two-step process (FIGS. 1a–1c). First, a silicon oxide substrate 1 is provided for the formation of a step-raised portion, for example, a polysilicon layer 10 as shown in the cross-sectional view FIG. 1a. The fabrication of the device may require that both the step-raised polysilicon layer 10 and its surrounding area be covered by an insulation layer, for example, silicon oxide insulator 12.

Because the polysilicon layer 10 has vertically rising sidewalls, forming the covering insulating layer 12, by deposition, for example, normally results in a step coverage of less than 100%. In other words, the insulating layer 12 on top of polysilicon layer 10 frequently has a thickness greater than the thickness of the same insulating layer covering the plane portions to the right and left of the polysilicon layer 10. A step coverage of less than 100% inevitably leads to the formation of the re-entrances 100 at the locations of the lower corners where the sidewalls of the polysilicon layer 10 intersect the silicon oxide substrate 1.

A conducting layer 14, for example, polysilicon, is then formed by a further deposition procedure on the surface of insulating layer 12. As can be seen in FIG. 1a, the layer of conducting material 14 also enters the re-entrance. The fabrication procedure may then require defining a conducting path pattern in conducting layer 14. This is normally done by forming a shielding mask layer 102, as indicated in FIG. 1a, having a predetermined width for defining the width of the conductor to be formed on the polysilicon layer 10. The substrate may then be subjected to an anisotropic etching process to remove all the portions of conducting layer 14 not shielded by the shielding layer 102. Anisotropic etching is preferred at this stage in order to obtain precise control of etching perpendicularly to substrate 1, so that the width of the conductor path formed from the conducting layer 14 can be precisely controlled.

As is indicated in FIG. 1b, only the portion of conducting layer 14 under shielding mask layer 102 is preserved; all exposed portions are removed by the anisotropic etching process, with the exception of the residuals inside re-entrances 100. This is an effect of the selected anisotropic etching process. These residuals form what is referred to as a stringer 16, as shown in the drawing. Stringer 16 is usually strip-shaped residual material of conducting layer 14 as viewed from the top Of the substrate, with a configuration shaped along the contour line that surrounds the polysilicon layer 10.

To remove these stringers 16, an isotropic etching process has to be carried out, with inevitable over-etching of the sidewalls of the path of conducting layer 14, resulting in reduced conducting path width (FIG. 1c). Thus, the isotropic etching procedure aimed at removing the stringer 16 may jeopardize the precision control over the conducting path width. On the other hand, if stringer 16 is not removed and is allowed to remain on the semiconductor substrate, a bridging effect may result, producing undesirable connections between circuit portions of the semiconductor device being fabricated.

In a typical semiconductor device, while the thickness of polysilicon layer 10 is in the range of about 3,000 to 4,000 Angstroms, the loss of the precision control over the conductor path width is about 0.3 to 0.4 µm. This level of precision loss is, however, unacceptable for present-day submicron semiconductor devices, which employ a photomasking pattern resolution finer than one micron.

To overcome this problem, it had been proposed to enlarge the width of the shielding mask layer 102 (FIGS. 1a–1c) used to produce conducting layer path 14. The idea is that when the isotropic etching process is completed, the extent of over-etching to the conducting layer path 14 will bring it to the desired width. However, this was not a practical method, since in a 0.6-micron process for fabricating semiconductor devices, for example, the photomasking pattern has a 0.6/0.6-micron line-to-spacing ratio for its pattern, and to reserve room for the isotropic over-etching, the line/spacing ratio has to be adjusted to 0.9-micron/0.3-micron, which adds an unfeasible degree of difficulty to the photomasks.

SUMMARY OF THE INVENTION

It is therefore an object of the present invention to provide a method for etching a conducting layer of the step-covered structure for a semiconductor while maintaining good control over the critical dimensions during the fabrication of the semiconductor device.

It is another object of the present invention to provide a method for etching a conducting layer of the step-covered structure in the semiconductor fabrication procedure that can be free of the strip-shaped stringers formed as a result of anisotropic etching due to the presence of re-entrances.

The present invention achieves the above-identified objects by providing a method for etching a conducting layer as part of the semiconductor device fabrication procedure. The method provides for the formation of the conductor path with defined and precise control over the path width. The fabricated semiconductor device has a step-raised layer-covering structural configuration on a substrate, and the step-raised layer-covering structural configuration forms re-entrances when an insulation layer is formed on top of the step-raised layer-covering structure and the portion of the substrate surrounding the structure. The method includes the steps of forming a conducting layer on the insulation layer and then forming a shielding mask on the conducting layer for defining a conducting path with a predetermined pattern. The method further comprises applying an anisotropic etching process for removing portions of the conducting layer not covered by the shielding mask. The method also forms residual stringers of the conducting layer material in the re-entrances. During the period of the anisotropic etching process, there are formed first protecting layers covering the sidewalls of the conducting path, as well as second protecting layers covering the stringers. The first protecting layers are thicker than the second protecting layers. The method finally applies an isotropic etching process to remove the second protecting layers and the stringers covered by the second protecting layers without affecting the conducting path.

BRIEF DESCRIPTION OF THE DRAWINGS

Other objects, features and advantages of the present invention will become apparent by way of the following detailed but nonlimiting description of the preferred embodiment. The description is made with reference to the accompanied drawings, wherein.

DESCRIPTION OF THE PREFERRED EMBODIMENTS

Figure 2A:
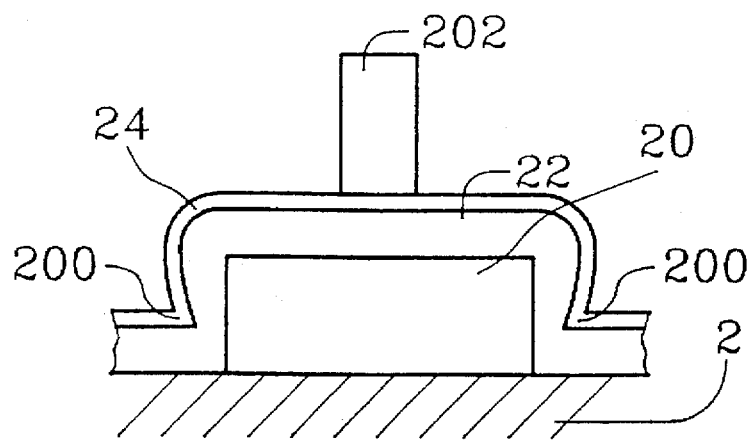
FIGS. 2a–2c show, respectively, in selected stages, the etching of a conducting layer in accordance with a method of a preferred embodiment of the present invention and cross sections of a portion of a semiconductor device with step-covered structural configuration.
Figure 2B:
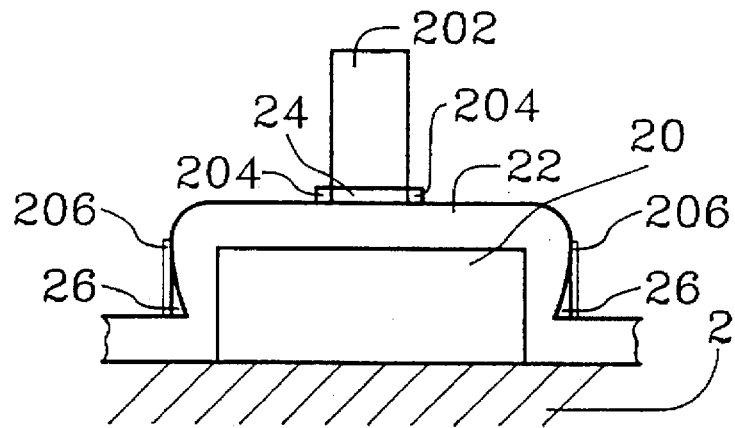
Figure 2C:
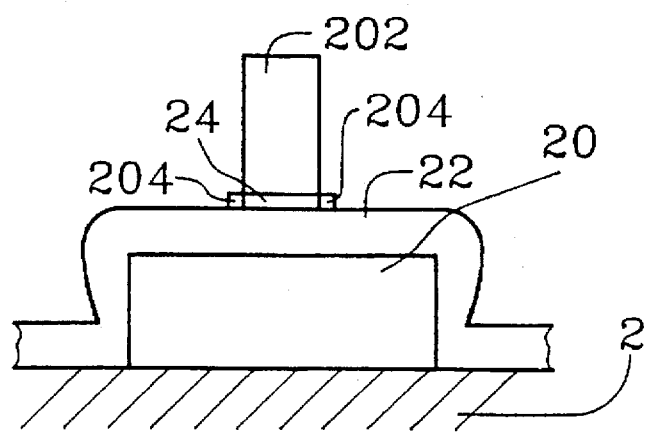

The following description refers to FIGS. 2a–2c, in which depict selected process stages of a conducting layer etching in accordance with a method of a preferred embodiment of the present invention.

Figure 1A:
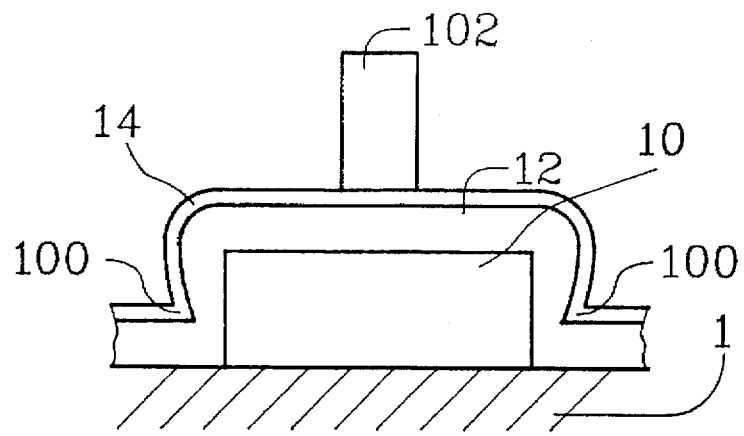
FIGS. 1a–1c show, respectively, in selected stages, the etching of a conducting layer in accordance with a conventional method and cross sections of a portion of a semiconductor device with step-covered structural configuration.
Figure 1B:
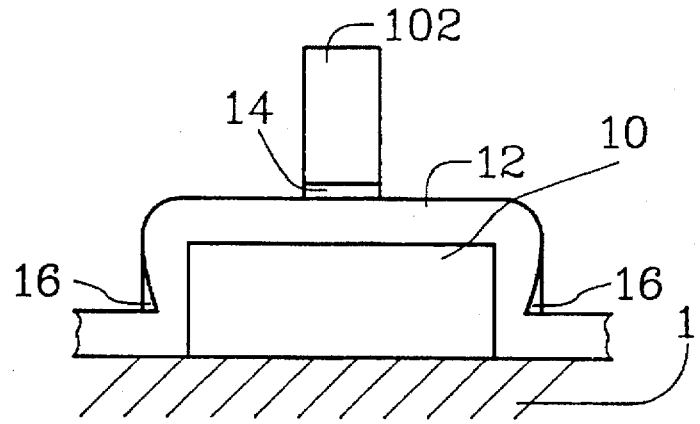
Figure 1C:
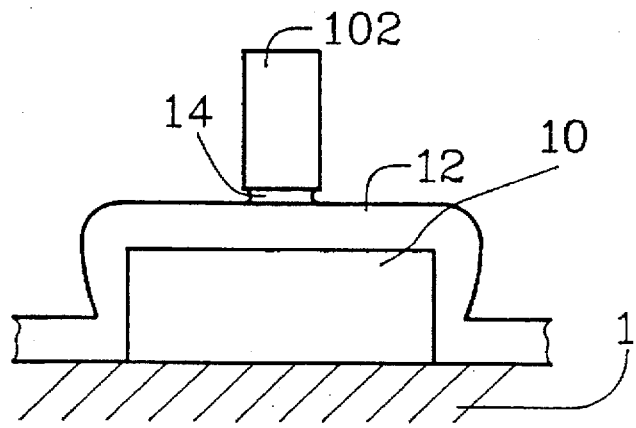

As seen in FIG. 2a, which parallels FIG. 1a, the conventional method, a step-raised polysilicon layer 20, for example, is prepared on a substrate 2 of silicon oxide, for example. As in the case of the conventional method described above, a layer of insulator 22, for example, silicon oxide, is deposited to cover step-raised polysilicon layer 20 as well as exposed surfaces of substrate 2 throughout its surrounding area. A conducting layer 24, for example, polysilicon is then deposited on the surface of insulating layer 22 to fabricate a defined conductor path having a pattern determined by a shielding mask 202. As in the conventional method described above, re-entrances 200 format corners where a vertical sidewall of step-raised polysilicon layer 20 meets a surface of silicon oxide substrate 2.

Next, as shown in FIG. 2b, the anisotropic etching procedure of the present invention is performed within the confinement of a plasma etching system, at a relatively high energy and a low gaseous pressure. The energy level is preferably in the range of 150–300 W, and the gas pressure is preferably in the range of 50–100 mT.

As is well known in the art, anisotropic etching procedures are controllable to be effective in any selected direction. As shown in FIG. 2b, the etching of the present invention is perpendicular to the plane of silicon oxide substrate 2. As in the conventional method, conducting layer 24 under shielding mask 202 is precisely etched to its desired width as determined by the width of shielding mask 202. As in the conventional method, due to the presence of the re-entrances 200, strip-shaped residuals, stringers 26, are present after the anisotropic etching procedure of the present invention.

However, since the anisotropic etching procedure of the present invention was conducted in a plasma etching environment, the presence of shielding mask 202 results in formation of protective layers 204 and 206 of polymers, for example, that surround conducting layer 24 and stringer 26, respectively. Because shielding mask 202 provides a shield, and because the distances between shielding mask 202 and conducting layer 24 and between stringers 26 and conducting layer 24 are different, the protective layers 204 formed surrounding conducting layer 24 will be thicker than the protective layers 206 formed around stringers 26, as can be seen schematically in FIG. 2b, (not drawn to exact scale).

Referring next to FIG. 2c, a second etching procedure is then conducted to remove the stringers 26. This second etching procedure, in accordance with the preferred embodiment of the present invention, should be an isotropic etching procedure performed in another plasma etching environment, but with controlled conditions of a relatively low energy and a high gas pressure. A preferred embodiment of the present invention employs an energy level in the range of about 50–150 W and a gas pressure in the range of about 200–400 mT.

In a plasma etching environment in a controlled isotropic etching procedure as just described, the etching rate to the polysilicon and the protective polymer will be in the range of about 5:1 to 10:1. Since the protective polymer material 204 surrounding conducting layer 24 is thicker than the protective polymer material 206 formed around the stringers 26, the thinner protective layers 206, as well as the stringers 26 thereunder, will be removed completely before the thicker protective layers 204 are totally consumed. Thus, after the isotropic etching process is concluded, the stringers 26 will be cleanly removed. Conducting path 24 remains untouched by this second isotropic etching, and its precise pattern width remains intact.

Based on the above description of the method in accordance with the preferred embodiment of the present invention, it is clearly appreciable that the plasma etching environment with controlled energy and pressure conditions provide the formation of the protective materials that are important to preventing conducting path 24 from being over-etched. Although specific values for the energy level and gas pressure are exemplified in the description of the present invention, persons skilled in the art will understand that the given values do not restrict the scope of the present invention, which is recited in the following claims.

What is claimed is:

1. A method for etching a conducting layer in semiconductor fabrication for devices having a step-raised layer structure overlying a substrate, said step-raised layer structure forming re-entrances when an insulation layer is formed over said step-raised layer structure and the portion of said substrate surrounding said structure, said method comprising the steps of:

forming a conducting layer on said insulation layer;

forming an etching mask on said conducting layer for defining a conducting path;

applying an anisotropic etching process for removing portions of said conducting layer not covered by said etching mask and forming residual stringers of said conducting layer in said re-entrances, said anisotropic etching process further forming first protecting layers covering the sidewalls of said conducting path and second protecting layers covering said stringers, wherein said first protecting layers are thicker than said second protecting layers; and applying an isotropic etching process for removing said second protecting layers and said stringers covered by said second protecting layers.

2. The method for etching a conducting layer in semiconductor fabrication of claim 1, wherein said anisotropic etching process is performed in a plasma etching environment having an energy level in the range of from about 150 W to about 300 W and a gas pressure in the range of from about 50 millitorr to about 100 millitorr.

3. The method for etching a conducting layer in semiconductor fabrication of claim 1, wherein said isotropic etching process is performed in a plasma etching environment having an energy level in the range of from about 50 W to about 150 W and a gas pressure in the range of from about 200 millitorr to about 400 millitorr.

4. The method for etching a conducting layer in semiconductor fabrication of claim 1, wherein said anisotropic etching process is performed in a plasma etching environment having an energy level in the range of from about 150 W to about 300 W and a gas pressure in the range of from about 50 millitorr to about 100 millitorr, and wherein said isotropic etching process is performed in a plasma etching environment having an energy level in the range of from about 50 W to about 150 W and a gas pressure in the range of from about 200 millitorr to about 400 millitorr.

5. The method for etching a conducting layer in semiconductor fabrication of claim 1, wherein said conducting layer is a polysilicon layer.

6. The method for etching a conducting layer in semiconductor fabrication of claim 5, wherein said first and second protecting layers are polymer.

7. The method for etching a conducting layer in semiconductor fabrication of claim 6, wherein the ratio between the rate of etching to said polysilicon and the rate of etching to said polymer is between about 5:1 and about 10:1.

8. The method for etching a conducting layer in semiconductor fabrication of claim 1, wherein said conducting layer is a metal layer.

9. The method for etching a conducting layer in semiconductor fabrication of claim 1, wherein said insulating layer is a silicon oxide layer.

* * * * *